June 3, 1969 K. W. KRAUSE 3,448,388
STROBE GATE CIRCUIT
Filed Aug. 3, 1966
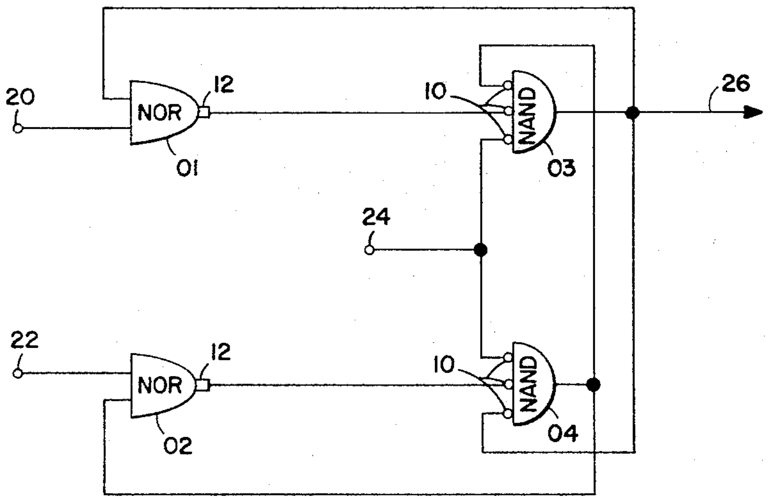
Kenneth W. Krause,
INVENTOR.
Harry M. Saragovitz
BY Edward J. Kelly
Herbert Berl
Alfred E. Smith United States Patent Office 3,448,388

Patented June 3, 1969

3,448,388

STROBE GATE CIRCUIT

Kenneth W. Krause, Clearwater, Fla., assignor, by mesne assignments, to the United States of America as represented by the Secretary of the Army Filed Aug. 3, 1966, Ser. No. 570,098
Int. Cl. H03k *19/34, 19/36*
U.S. Cl. 328—93 4 Claims This invention relates generally to logic circuits, and particularly to a strobe gate circuit for sampling narrow signals, and having self-latching means to produce an output signal without controlling the strobe enable pulse width.

Gate circuits are used extensively in computers or any digital network in which a given output or series of outputs are desired for a particular input complex. Improvement in components continue to result in increasing degrees of precision, reliability, and speed.

An object of this invention is to provide a means for rapidly sampling an electrical signal without the need to control the pulse width of the strobe enable pulse.

A further object of this invention is to reduce circuit delay and provide reliability by using a minimum of stages which must be preset.

Another object of this invention is to reduce the power consumption through utilization of standard logic components.

Another object of this invention is to utilize simple circuit design and control.

This invention will be better understood from the following detailed description when taken in connection with the accompanying drawing.

The single figure shows a logic schematic incorporating the embodiment of this invention and containing four logic elements.

Referring to the single figure, a small circle 10 at the input to a logic element indicates that a relatively low input signal activates the function. Conversely, the absence of a small circle indicates that a relatively high input signal activates the function. A small square 12 at the output indicates that the output terminal of the activated function is relatively low.

Logic elements 01 and 02 are NOR gates in which the activated output is low when either or both input functions are high.

Logic elements 03 and 04 are NAND gates in which the activated output is high when all of the input functions are low.

Normal or steady state conditions of the circuit are such that the strobe enable signal on input terminal 24 is high, thereby producing a high input at gates 03 and 04. Any high input signal at gate 03 will produce a low output from the path between gate 03 and the inputs of gates 01 and 04. Similarly, a low output from the path between gate 04 and the inputs of gates 02 and 03 will be produced. Input terminals 20 and 22 are driven by a bipolar sense amplifier output and it is such that the signal at terminal 20 is 180° out of phase with the signal at terminal 22; therefore, when the signal at terminal 20 is high, the signal at terminal 22 is low, and when the signal at terminal 22 is high, the signal at terminal 20 is low.

In conjunction with the said normal condition, if the input signal at terminal 20 is high, the output path from gate 01 to gate 03 will be low. Concurrently, the low signal at terminal 22 in combination with the low output from 04 will cause the output path from 02 to 04 to be high. At strobe time, the strobe enable input at terminal 24 will change to low; because the other inputs to gate 03 are also low, the gate is activated to provide a high output and to set up a feedback loop through gates 01 and

04 to latch gate 03. Gate 03 will remain latched for the duration of the strobe enable pulse at terminal 24 and will not be affected by changes appearing on input terminals 20 and 22.

In conjunction with the said normal circuit conditions, if the signal on input terminal 20 is low, the low inputs to gate 01 will cause the gate 01 output path to gate 03 to be high. At the same time, the signal on input terminal 22 will be high so the output path from gate 02 to gate 04 will be low. At strobe time, the strobe enable input at terminal 24 will change to low; because the other inputs to gate 04 are also low, the gate activated to provide a high output and set up a feedback loop through gates 02 and 03 to latch gate 04 for the duration of the strobe enable pulse at terminal 24, and will be unaffected by variable changes at terminals 20 and 22.

Although a particular embodiment and form of this invention has been illustrated, it is understood that modifications may be made by those skilled in the art without departing from the scope and spirit of the foregoing disclosure.

What is claimed is:

1. A gate circuit comprising: a plurality of NOR gates, each having an output and a plurality of inputs; a plurality of NAND gates, each having an output and a plurality of inputs; the output of each said NOR gate is connected as an input to a corresponding input of one of said NAND gates; the output of a first one of said NAND gates is connected as an input, different from said corresponding input, to at least one other of said NAND gates and as an input to a first one of said NOR gates; the output of said other NAND gate being connected as an input to the corresponding NOR gate and as an input to at least the said first NAND gate; an additional input connected to another input of each of said NAND gates.

2. The gate circuit as defined in claim 1 wherein said plurality of NOR gates comprise a first and a second NOR gate; and said plurality of NAND gates comprise a first and second NAND gate.

3. The gate circuit as defined in claim 2 wherein said additional input comprises a strobe enable pulse of variable pulse width.

4. A gate circuit as set forth in claim 1 wherein said plurality of NOR gates consist of first and second NOR gates, each having an output and first and second inputs; and said plurality of NAND gates consist of first and second NAND gates, each having an output and first, second, and third inputs; the output of said first NOR gate being connected to said first input to said first NAND gate; the output of said second NOR gate being connected to said first input to said second NAND gate; the output of said first NAND gate being connected to said second input of said second NAND gate and said second input of said first NOR gate; the output of said second NAND gate being connected to said second input of said first NAND gate and said second input of said second NOR gate; and wherein said additional input is connected to said third inputs of said first and second NAND gates.

References Cited

UNITED STATES PATENTS 3,139,540 6/1964 Osborne ---------- 307—215

ROY LAKE, *Primary Examiner.*

JAMES B. MULLINS, *Assistant Examiner.*

U.S. Cl. X.R.

307—215